United States Patent [19]

Koury

[11] Patent Number: 4,876,212

[45] Date of Patent: Oct. 24, 1989

[54] PROCESS FOR FABRICATING COMPLIMENTARY SEMICONDUCTOR DEVICES HAVING PEDESTAL STRUCTURES

[75] Inventor: Daniel N. Koury, Ithaca, N.Y.

[73] Assignee: Motorola Inc., Schaumburg, Ill.

[21] Appl. No.: 103,321

[22] Filed: Oct. 1, 1987

[51] Int. Cl.⁴ .................. H01L 21/265; H01L 21/20
[52] U.S. Cl. ........................... 437/34; 148/DIG. 26;
148/DIG. 53; 148/DIG. 135; 148/33.3;
156/644; 156/657; 156/613; 357/42; 357/55;
437/56; 437/62; 437/70; 437/86; 437/974
[58] Field of Search ................... 437/29, 31, 41, 34,
437/90, 99, 103, 62, 86, 89, 57, 56, 203, 239,
915, 974, 193; 148/DIG. 11, 26, 50, 53, 117,
122, 135, 164, 33.3, 33.4; 156/644, 653, 657,
610–614; 357/34, 22, 42, 59 G, 57 R, 50, 55

[56] References Cited

U.S. PATENT DOCUMENTS

| | | | |
|---|---|---|---|
| 3,508,980 | 4/1970 | Jackson, Jr. et al. | 437/86 |
| 3,575,731 | 4/1971 | Hoshi et al. | 437/86 |
| 3,600,651 | 8/1971 | Duncan | 148/DIG. 167 |
| 3,959,045 | 5/1976 | Antypas | 437/86 |
| 4,142,925 | 3/1979 | King et al. | 156/657 |
| 4,230,505 | 10/1980 | Wu et al. | 156/657 |
| 4,556,585 | 12/1985 | Abernathey et al. | 437/86 |
| 4,649,627 | 3/1987 | Abernathey et al. | 148/DIG. 164 |
| 4,651,407 | 3/1987 | Bencuya | 357/22 |
| 4,663,831 | 5/1987 | Birrittella et al. | 437/90 |
| 4,686,758 | 8/1987 | Liu et al. | 437/89 |
| 4,696,097 | 9/1987 | McLaughlin et al. | 437/31 |

FOREIGN PATENT DOCUMENTS 0220463  9/1986  Japan ........................... 437/31

OTHER PUBLICATIONS

Ning et al., "MOSFET Structure", IBM TDB, vol. 25, No. 3A, Aug. 1982, pp. 1179–1182.
Shinchi et al., "The Buried Oxide MOSFET-A New Type of High–Speed Switching Device", IEEE Trans. Electron Devices, Oct. 1976, pp. 1190–1191.
Arienzo et al., "Simple Technique to Make Symmetrical Transistors", IBM TDB, vol. 27, No. 4B, Sep. 1984, pp. 2371–2373.
Tang et al., "A Symmetrical Bipolar Structure", IEEE Electron Devices Meeting, Dec. 8–10, 1980, pp. 58–60.

Primary Examiner—Olik Chaudhuri
Assistant Examiner—William Bunch
Attorney, Agent, or Firm—Harry Wolin

[57] ABSTRACT

A process for fabricating complimentary semiconductor devices having pedestal structures wherein both PNP and NPN transistors are formed simultaneously on the same substrate. After polysilicon layers have been patterned and etched, various polysilicon regions are doped with a plurality of conductivity types. This allows for there to be both P+ and N+ regions in the same polysilicon layer thereby enabling complimentary PNP and NPN transistors to be formed using a limited number of processing steps.

24 Claims, 3 Drawing Sheets

PROCESS FOR FABRICATING COMPLIMENTARY SEMICONDUCTOR DEVICES HAVING PEDESTAL STRUCTURES

BACKGROUND OF THE INVENTION

This invention generally pertains to a process for fabricating complimentary semiconductor devices having pedestal structures. Generally, in digital and linear bipolar circuitry as well as other applications, it is desirable to have complimentary semiconductor devices which allow for high performance while requiring a relatively small amount of space. This allows for greater flexibility in circuit design. The pedestal structure enables semiconductor devices to be fabricated which require relatively small amounts of space. However, the prior art has experienced difficulty in that it has been expensive and required many processing steps to process complimentary isolated PNP and NPN transistors on the same substrate. The present invention allows for complimentary isolated PNP and NPN transistors to be formed on the same substrate by incorporating additional masking and doping steps.

SUMMARY OF THE INVENTION

The present invention pertains to a process for fabricating complimentary semiconductor devices having pedestal structures. Further, the present invention allows for complimentary isolated PNP and NPN transistors to be formed simultaneously on the same substrate. After an initial dielectric layer is formed on a substrate, a polysilicon layer is formed and then patterned and etched. Next, various etched portions of the polysilicon layer are doped with one conductivity type while other etched portions of the polysilicon layer are doped with a second conductivity type. Following the formation of another dielectric layer, a second polysilicon layer is formed, patterned, etched and then doped in the same manner. Because each etched polysilicon layer contains different conductivity types, complimentary isolated PNP and NPN transistors may be formed simultaneously on the same substrate. Additionally, a silicon-on-insulator process may be implemented using the present invention thereby solving problems caused by substrate interactions.

It is an object of the present invention to provide a new and improved process for fabricating complimentary semiconductor devices having pedestal structures wherein isolated PNP and NPN transistors are formed simultaneously on the same substrate.

It is a further object of the present invention to provide a new and improved process for fabricating complimentary semiconductor devices having pedestal structures which allows for higher performance and greater flexibility in circuit design.

It is a further object of the present invention to provide a new and improved process for fabricating complimentary semiconductor devices having a pedestal structures wherein etched polysilicon layers may be doped with a plurality of conductivity types.

It is a further object of the present invention to provide a new and improved process for fabricating complimentary semiconductor devices having pedestal structures wherein a dielectric diffusion barrier is formed to reduce substrate interactions.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures.

DESCRIPTION OF THE PREFERRED EMBODIMENT

Figure 1:
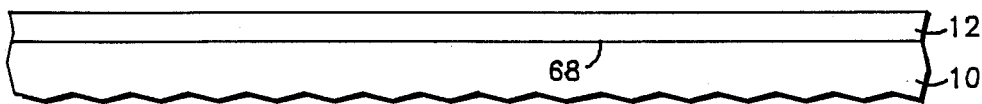
FIGS. 1-6 are highly enlarged cross-sectional views of sections of complimentary semiconductor devices having pedestal structures during various stages of processing.
Figure 2:
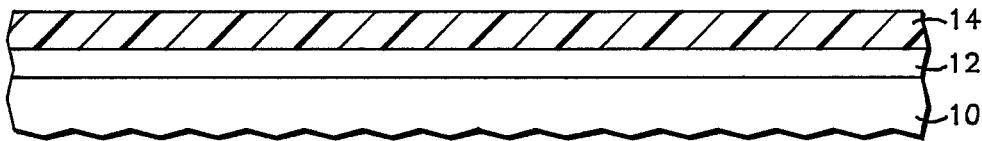
Figure 3:
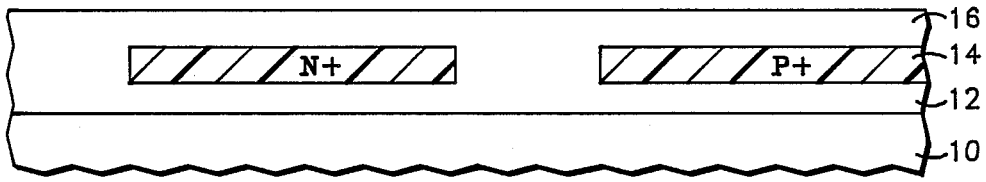
Figure 4:
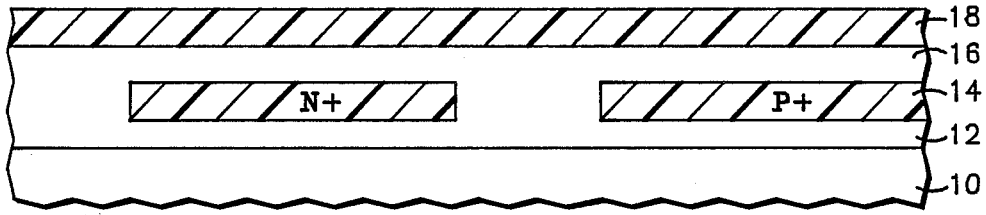
Figure 5:
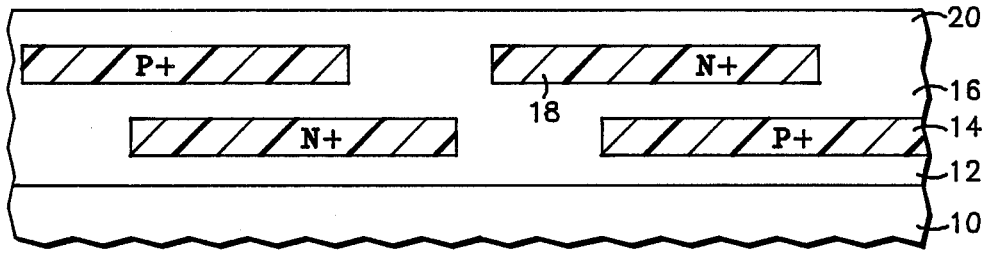
Figure 6:
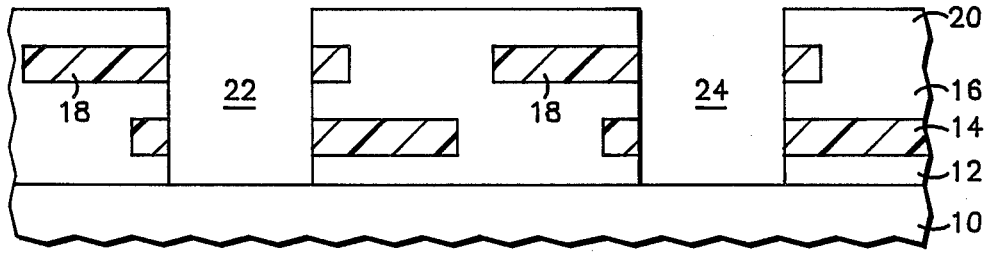

Referring specifically to FIGS. 1-6, highly enlarged cross-sectional views of sections of complimentary semiconductor devices having pedestal structures are shown during various stages of processing. Initially, a first substrate, 10, is provided and a first dielectric layer, 12, is formed thereon. Generally, substrate 10 is a single crystal silicon semiconductor substrate but those skilled in the art will understand that other types of substrates may be used. A first polysilicon layer, 14, is formed on first dielectric layer 12 and then patterned and etched in a predetermined manner. Oversize block-out masks are then used so that etched first polysilicon layer 14 may be doped with a plurality of conductivity types. In this embodiment, regions of first polysilicon layer 14 are doped first with a P+ dopant followed by other regions of first polysilicon layer 14 being doped with an N+ dopant. Although many methods of doping may be used in the present invention, this embodiment employs ion implantation.

Once first polysilicon layer 14 is etched and doped with a plurality of conductivity types, a second dielectric layer, 16, is formed between regions of first polysilicon layer 14 and on first polysilicon layer 14. A second polysilicon layer, 18, is formed on second dielectric layer 16. Second polysilicon layer 18 is patterned, etched and doped in the same manner as first polysilicon layer 14. It will be understood by one skilled in the art that corresponding regions of first polysilicon layer 14 and second polysilicon layer 18 should be doped in opposite conductivity types as shown so that the semiconductor devices may function properly.

Following the doping of second polysilicon layer 18, a third dielectric layer, 20, is formed between regions of second polysilicon layer 18 and on second polysilicon layer 18. Once third dielectric layer 20 has been formed on second polysilicon layer 18, a first opening, 22, and a second opening, 24, are formed. Opening 22 and opening 24 both extend through first dielectric layer 12, second dielectric layer 16 and third dielectric layer 20 as well as through first polysilicon layer 14 and second polysilicon layer 18. Openings 22 and 24 further extend to first substrate 10.

Figure 7:
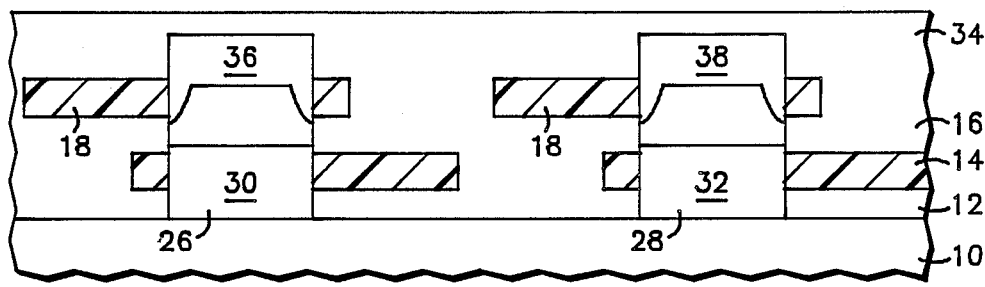
FIGS. 7 and 8 are highly enlarged cross-sectional views of sections of complimentary semiconductor devices having pedestal structures showing a first embodiment of the present invention during various stages of processing.
Figure 8:
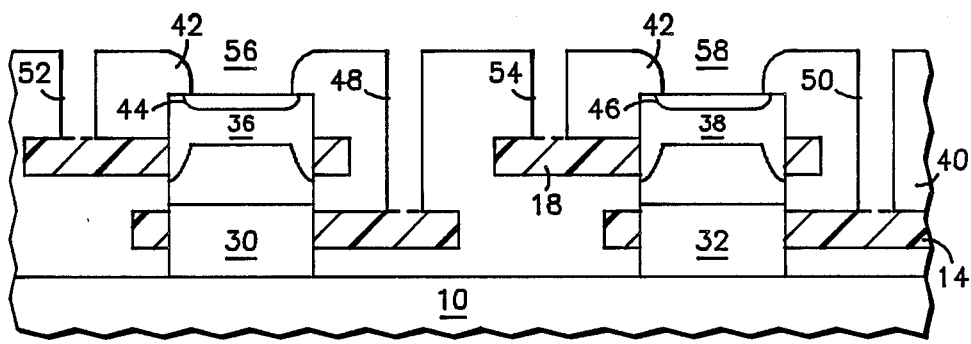

Referring specifically to FIGS. 7 and 8, highly enlarged cross-sectional views of sections of a first embodiment of complimentary semiconductor devices having pedestal structures are shown during various stages of processing. Following the formation of openings 22 and 24, a first epitaxial region, 26, and a second epitaxial region, 28, are formed in first opening 22 and second opening 24 respectively. Epitaxial regions 26 and 28 extend to the top of openings 22 and 24. In this embodiment, epitaxial regions 26 and 28 are selectively grown on first substrate 10 and are comprised of a single crystal silicon material. Then, either during or directly after the formation of epitaxial regions 26 and 28, a first collector, 30, is formed in first epitaxial region 26, while a second collector, 32, is formed in second epitaxial region 28. In this embodiment, collectors 30 and 32 are formed by ion implantation however it should be understood that collectors 30 and 32 may be formed by many methods well known in the art.

Following the formation of epitaxial regions 26 and 28, a fourth dielectric layer, 34, is formed on third dielectric layer 20 and epitaxial regions 26 and 28. A first base, 36, and a second base, 38, are formed in epitaxial regions 26 and 28, respectively, either before or after the formation of fourth dielectric layer 34. If bases 36 and 38 are formed before the formation of fourth dielectric layer 34, they may be formed during or directly after the formation of epitaxial regions 26 and 28. Bases 36 and 38 may be formed by many methods well known in the art, however, ion implantation is used in the present embodiment. Note that collectors 30 and 32 are connected to first polysilicon layer 14 while bases 36 and 38 are connected to second polysilicon layer 18. It should be noted that the various regions of epitaxial region 26 are of different conductivity types than those of epitaxial region 28. Commonly, the conductivity types of the various regions of epitaxial regions 26 and 28 will be opposite. This may be accomplished by forming epitaxial regions 26 and 28 separately, using blockout masks or by other methods obvious to those skilled in the art. The conductivity types of the various regions of epitaxial regions 26 and 28 will correspond to the regions of the polysilicon layers to which they are coupled.

A sidewall spacer dielectric layer, 40, is then formed on fourth dielectric layer 34. It should be understood, however, that fourth dielectric layer 34 may itself be used as a sidewall spacer dielectric layer rather than forming additional sidewall spacer dielectric layer 40. In either circumstance, a portion of sidewall spacer dielectric layer 40 is etched away thereby exposing epitaxial regions 26 and 28. This allows for the formation of sidewall spacers, 42, and also a first emitter contact opening, 56, and a second emitter contact opening, 58, are formed over epitaxial regions 26 and 28 in between sidewall spacers 42. Sidewall spacers 42 are portions of dielectric material which extend over epitaxial regions 26 and 28 and serve to limit the size of the emitters. A first emitter, 44, and a second emitter, 46, may now be formed in epitaxial regions 26 and 28 respectively. Again, if emitters 44 and 46 are formed at this time, ion implantation is used in this embodiment although other methods may also be used to form emitters 44 and 46. Next, a first collector contact opening, 48, and a second collector contact opening, 50, are etched so that they extend to various regions of first polysilicon layer 14. In the same manner, a first base contact opening, 52, and a second base contact opening, 54, are etched and extend to various regions of second polysilicon layer 18.

Figure 9:
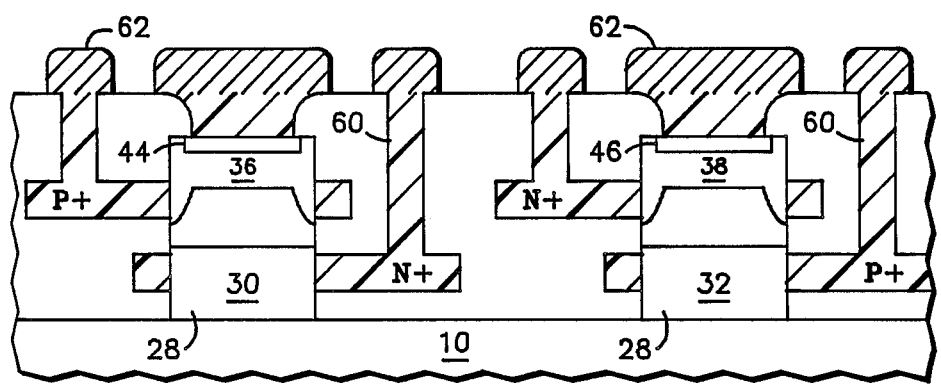
FIG. 9 is a highly enlarged cross-sectional view of a section of complimentary semiconductor devices having pedestal structures showing a first embodiment of the present invention.

Referring specifically to FIG. 9, a highly enlarged cross-sectional view of a first embodiment of a section of complimentary semiconductor devices having pedestal structures are shown. A contact polysilicon, 60, is formed in collector contact openings 48 and 50, base contact openings 52 and 54, and emitter contact openings 56 and 58. It should be understood that metal or metal silicide may be used in place of contact polysilicon 60 in some or all of the contact openings. Metal may be selectively deposited or deposited non-selectively and then planarized by methods well known in the art. In some applications, materials other than polysilicon may be desired due to lower resistivity and the ease of planarization of softer materials.

After contact polysilicon 60 is formed, it is selectively doped so that its conductivity type in various regions corresponds to that of the regions of first polysilicon layer 14, second polysilicon layer 18, or the emitter regions of epitaxial regions 26 and 28 which it contacts. First emitter 44 and second emitter 46 may be formed at this time if they were not formed as previously discussed. Once contact polysilicon 60 is doped in emitter contact openings 56 and 58, contact polysilicon 60 in emitter contact openings 56 and 58 may be diffused to form emitters 44 and 46. After the doping of contact polysilicon 60, electrical contacts 62 are formed on collector contact openings 48 and 50, base contact openings 52 and 54, and emitter contact openings 56 and 58. Although electrical contacts 62 may be made of many conductive materials, they are made of a metal in this embodiment.

It should be understood by those skilled in the art that this first embodiment of complimentary semiconductor devices having pedestal structures requires doping on first substrate 10. Isolation must be provided so that transistors having the same collector polarity as first substrate 10 will not be electrically coupled. Device isolation is provided by methods well known in the art.

Figure 10:
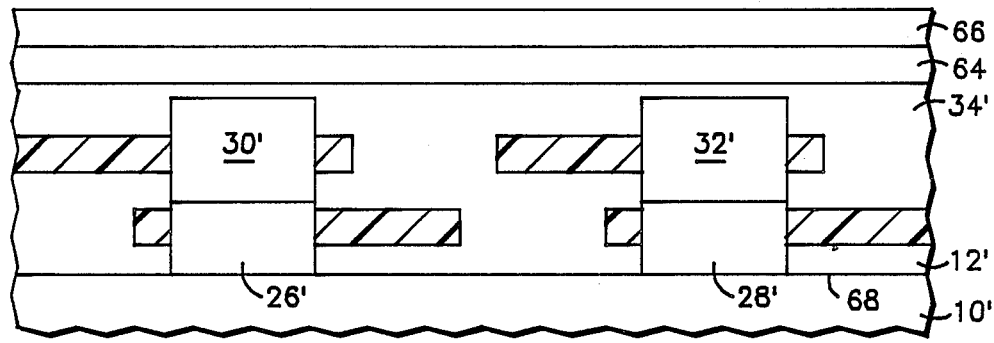
FIGS. 10 and 11 are highly enlarged cross-sectional views of sections of complimentary semiconductor devices having pedestal structures showing a second embodiment of the present invention during various stages of processing.
Figure 11:
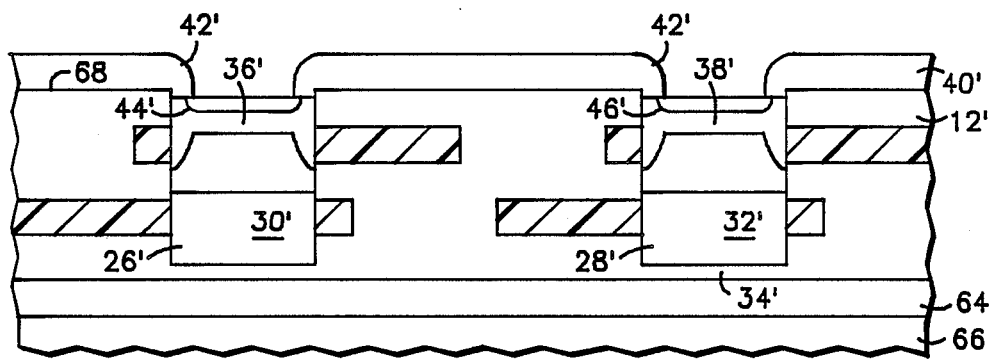
Figure 12:
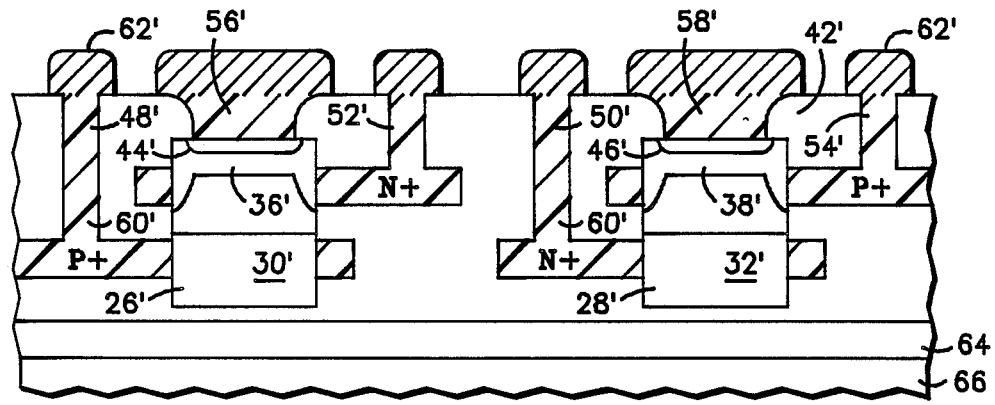
FIG. 12 is a highly enlarged cross-sectional view of a section of complimentary semiconductor devices having pedestal structures showing a second embodiment of the present invention.

Referring specifically to FIGS. 10–12, highly enlarged cross-sectional views of sections of a second embodiment of complimentary semiconductor devices having pedestal structures are shown during various stages of processing. Following the formation of openings 22 and 24 (see FIG. 6), epitaxial regions 26' and 28' are formed in openings 22 and 24 respectively. During or directly following the formation of epitaxial regions 26' and 28', collectors 30' and 32' are formed therein. As in the previous embodiment, collectors 30' and 32' may be formed by many methods well known in the art however ion implantation is used in present embodiment.

Following the formation of epitaxial regions 26' and 28', fourth dielectric layer 34' is formed on epitaxial regions 26' and 28' as well as third dielectric layer 20'. Next, a dielectric diffusion barrier layer, 64, is formed on fourth dielectric layer 34'. Typically, dielectric diffusion barrier layer 64 is a silicon nitride material which serves as a good isolator between epitaxial regions 26 and 28 and a second substrate, 66. This is followed by second substrate 66 being bonded to dielectric diffusion barrier layer 64. Commonly, epoxy bonding is used to bond second substrate 66 to diffusion dielectric layer 64 but other methods may be used. See copending application entitled "Process for Making an Inverted Silicon-on-Insulator Semiconductor Device Having a Pedestal Structure", filed July 31, 1987, and having Ser. No. 079,984. Additionally, since second substrate 66 is isolated from epitaxial regions 26' and 28', it may be made of many materials well known in the art.

After second substrate 66 is bonded to dielectric diffusion barrier layer 64, the complimentary semiconductor devices are inverted and first substrate 10' is removed (see FIG. 11). After its removal, epitaxial regions 26' and 28' are etched back so that they are a predetermined distance below a first surface, 68, of first dielectric layer 12' where layer 12' originally contacted first substrate 10. This etching allows for the portions of epitaxial regions 26' and 28' which may have been damaged during the removal of substrate 10' to be removed. Additionally, the inversion and etching allows for high quality material in what will be the emitter regions of epitaxial regions 26' and 28'. Following the etching of epitaxial regions 26' and 28', first base 36' and second base 38' are formed in epitaxial regions 26' and 28' respectively. Again, as in the previous embodiment, bases 36' and 38' are formed by ion implantation although they may be formed using other methods well known in the art.

Referring now to FIGS. 11-12, once bases 36' and 38' have been formed, sidewall spacer dielectric layer 40' is formed on first dielectric layer 12' and epitaxial regions 26' and 28'. Again, sections of sidewall spacer dielectric layer 40' are etched away so that epitaxial regions 26 and 28 are exposed. This allows for the formation of sidewall spacers 42'. As explained above, sidewall spacers 42' enable the size of emitters 44' and 46' to be limited. Emitters 44' and 46' again may be formed using one of the two methods shown in the first embodiment. Additionally, collector contact openings 48' and 50' and base contact openings 52' and 54' are etched so that they extend to the corresponding polysilicon layer and then along with emitter contact openings 56' and 58' are filled with contact polysilicon 60'. Again, contact polysilicon 60 is doped accordingly and electrical contacts 62' are formed as discussed previously. Additionally, it should be understood that the various dielectric layers discussed above may be an oxide, a nitride, or a combination of oxide and nitride. Although bipolar semiconductor devices have been shown and described, complimentary MOS devices may also be fabricated using this invention in the manner disclosed in copending application entitled "Process for Making an Inverted Silicon-On-Insulator Semiconductor Device Having a Pedestal Structure". Ser. No. 079,984.

Thus it is apparent that there has been provided, in accordance with the invention, an improved process for fabricating complimentary semiconductor devices having pedestal structures which meets the objects and advantages set forth above. Thus, while specific embodiments of the present invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of this invention.

I claim:

1. A process for fabricating complimentary semiconductor devices having pedestal structures comprising the steps of:
   providing a first substrate;
   forming a first dielectric layer on said first substrate;
   forming a first polysilicon layer on said first dielectric layer;
   patterning and etching said first polysilicon layer in a predetermined manner;
   doping said first polysilicon layer with a plurality of conductivity types;
   forming a second dielectric layer on said first polysilicon layer;
   forming a second polysilicon layer on said second dielectric layer;
   patterning and etching said second polysilicon layer in a predetermined manner;
   doping said second polysilicon layer with a plurality of conductivity types;
   forming a third dielectric layer on said second polysilicon layer;
   patterning and forming a plurality of openings through said first, second and third dielectric layers and said first and second polysilicon layers, said openings extending from said first substrate;
   forming epitaxial regions in said openings; and
   forming a plurality of contact openings, members of said plurality of contact openings extending to said first polysilicon layer, said second polysilicon layer and said epitaxial regions.

2. The process of claim 1 wherein the steps of doping the first and second polysilicon layers are performed by ion implantation.

3. The process of claim 1 wherein a collector, a base and an emitter are formed in each epitaxial region.

4. The process of claim 3 wherein the base, the collector and the emitter are formed using ion implantation.

5. The process of claim 3 wherein contact polysilicon is formed in the contact openings, said contact polysilicon further being doped to correspond to the conductivity type of one of the first polysilicon layer, the second polysilicon layer and the epitaxial regions.

6. The process of claim 5 wherein electrical contacts are formed on the doped contact polysilicon.

7. The process of claim 3 wherein a fourth dielectric layer is formed on the epitaxial regions and the third dielectric layer.

8. The process of claim 7 wherein a sidewall spacer dielectric layer is formed on the fourth dielectric layer prior to the formation of the emitter, said sidewall spacer dielectric layer and said fourth dielectric layer further being etched over said epitaxial regions to form sidewall spacers.

9. The process of claim 8 wherein the fourth dielectric layer and the sidewall spacer dielectric layer are formed simultaneously.

10. The process of claim 7 further comprising the steps of:
    forming a dielectric diffusion barrier layer on the fourth dielectric layer;
    bonding a second substrate on said dielectric diffusion barrier layer;
    inverting the complimentary semiconductor devices; and
    removing the first substrate.

11. The process of claim 10 wherein the diffusion of dielectric layer is comprised of a nitride.

12. The process of claim 10 wherein the epitaxial regions are etched back a predetermined distance below a first surface of the first dielectric layer following the removal of the first substrate.

13. The process of claim 12 wherein a sidewall spacer dielectric layer is formed on the epitaxial regions and the first dielectric layer, said sidewall spacer dielectric layer further being etched over said epitaxial regions to form sidewall spacers thereon.

14. A process for fabricating complimentary semiconductor devices having pedestal structures comprising the steps of:
   providing a first substrate;
   forming a first dielectric layer on said first substrate;
   forming a first polysilicon layer on said first dielectric layer;
   patterning and etching said first polysilicon layer in a predetermined manner;
   doping said first polysilicon layer with a plurality of conductivity types;
   forming a second dielectric layer on said first polysilicon layer;
   forming a second polysilicon layer on said second dielectric layer;
   patterning and etching said second polysilicon layer in a predetermined manner;
   doping said second polysilicon layer with a plurality of conductivity types;
   forming a third dielectric layer on said second polysilicon layer;
   patterning and forming a plurality of openings through said first, second and third dielectric layers and said first and second polysilicon layers, said openings extending from said first substrate;
   forming epitaxial regions in said openings;
   forming a collector in each epitaxial region during or following the formation thereof;
   forming a base in each epitaxial region;
   forming a sidewall spacer dielectric layer on said third dielectric layer and said epitaxial regions;
   etching said sidewall spacer dielectric layer over said epitaxial regions to form sidewall spacers;
   forming an emitter in each epitaxial region;
   forming a plurality of contact openings, members of said plurality of contact openings extending to said first polysilicon layer, said second polysilicon layer and said epitaxial regions;
   forming contact polysilicon in said plurality of contact openings;
   doping said contact polysilicon to correspond to the regions of said first polysilicon layer, said second polysilicon layer or said epitaxial regions coupled thereto; and
   forming a plurality of electrical contacts over said plurality of contact openings on said contact polysilicon.

15. The process of claim 14 wherein the step of forming an emitter in each epitaxial region is performed following the step of doping said contact polysilicon.

16. The process of claim 14 wherein the steps of forming a collector, forming a base, forming an emitter, doping said first and second polysilicon layers and doping said contact polysilicon are performed by ion implantation.

17. The process of claim 14 wherein the dielectric layers are nitride, oxide or a combination of oxide and nitride.

18. A process for fabricating complimentary silicon-on-insulator semiconductor devices having pedestal structures comprising the steps of:
   providing a first substrate;
   forming a first dielectric layer on said first substrate;
   forming a first polysilicon layer on said first dielectric layer;
   patterning and etching said first polysilicon layer in a predetermined manner;
   doping said first polysilicon layer with a plurality of conductivity types;
   forming a second dielectric layer on said first polysilicon layer;
   forming a second polysilicon layer on said second dielectric layer;
   patterning and etching said second polysilicon layer in a predetermined manner;
   doping said second polysilicon layer with a plurality of conductivity types;
   forming a third dielectric layer on said second polysilicon layer;
   patterning and forming a plurality of openings through said first, second an third dielectric layers and said first and second polysilicon layers, said openings extending from said first substrate;
   forming epitaxial regions in said openings;
   forming a collector in each epitaxial region during or following the formation thereof;
   depositing a fourth dielectric layer on said epitaxial regions and said third dielectric layer;
   bonding a second substrate on said fourth dielectric layer;
   inverting said complimentary semiconductor devices;
   removing said first substrate;
   forming a base in each epitaxial region;
   forming a sidewall spacer dielectric layer on said epitaxial regions and said first dielectric layer;
   etching said sidewall spacer dielectric layer over said epitaxial regions to form sidewall spacers;
   forming an emitter in each epitaxial region;
   forming a plurality of contact openings, members of said plurality of contact openings extending to said first polysilicon layer, said second polysilicon layer and said epitaxial regions;
   forming contact polysilicon in said plurality of contact openings;
   doping said contact polysilicon to correspond to the regions of said first polysilicon layer, said second polysilicon layer or said epitaxial regions coupled thereto; and
   forming a plurality of electrical contacts over said plurality of contact openings on said contact polysilicon.

19. The process of claim 18 wherein the step of forming a fourth dielectric layer includes forming a nitride layer.

20. The process of claim 19 wherein the step of forming a fourth dielectric layer includes forming an oxide layer and then forming a nitride layer on said oxide layer.

21. The process of claim 18 wherein the epitaxial regions are etched back a predetermined distance below a first surface of the first dielectric layer following the removal of the first substrate.

22. The process of claim 18 wherein the step of forming an emitter in each epitaxial region is performed following the step of doping said contact polysilicon.

23. The process of claim 18 wherein the steps of forming a collector, forming a base, forming an emitter, doping said first and second polysilicon layers and doping said contact polysilicon are performed by ion implantation.

24. The process of claim 18 wherein the dielectric layers are nitride, oxide or a combination of oxide and nitride.

* * * * *